United States Patent [19]
Ebinuma et al.

[11] Patent Number: 5,161,176
[45] Date of Patent: Nov. 3, 1992

[54] EXPOSURE APPARATUS

[75] Inventors: Ryuichi Ebinuma, Kawasaki; Kunitaka Ozawa, Isehara; Takao Kariya, Hino; Shunichi Uzawa, Tokyo; Noriyuki Nose, Machida, all of Japan

[73] Assignee: Canon Kabushiki Kaisha, Tokyo, Japan

[21] Appl. No.: 802,705

[22] Filed: Dec. 6, 1991

Related U.S. Application Data

[63] Continuation of Ser. No. 718,928, Jun. 25, 1991, abandoned, which is a continuation of Ser. No. 584,796, Sep. 19, 1990, abandoned.

[30] Foreign Application Priority Data

Sep. 21, 1989 [JP] Japan ................... 1-243290

[51] Int. Cl.⁵ ............................................. G21K 5/00
[52] U.S. Cl. ....................... 378/34; 378/151; 378/152; 359/232; 359/889
[58] Field of Search ............... 378/34, 145, 147, 156, 378/157, 152, 160; 355/67, 71; 350/266, 272, 271, 315; 250/492.1, 492.2, 492.21, 492.3, 565.1

[56] References Cited

U.S. PATENT DOCUMENTS

| | | | |
|---|---|---|---|
| 3,668,990 | 6/1972 | Hayes | 350/271 |
| 3,984,680 | 10/1976 | Smith | 378/34 |
| 4,777,641 | 10/1988 | Inagaki et al. | 378/34 |
| 4,881,257 | 11/1989 | Nakagawa | 378/34 |
| 4,887,282 | 12/1989 | Mueller | 378/34 |
| 4,891,833 | 1/1990 | Bernardi | 378/152 |

FOREIGN PATENT DOCUMENTS

| | | |
|---|---|---|
| 0136672 | 4/1985 | European Pat. Off. |
| 0326540 | 8/1989 | European Pat. Off. |
| 0358521 | 3/1990 | European Pat. Off. |
| 60-45252 | 3/1985 | Japan |
| 62-262428 | 11/1987 | Japan |

OTHER PUBLICATIONS

Patent Abstracts of Japan, Kokai No. 61-131445, vol. 10, No. 319, Oct. 30, 1986.

Primary Examiner—David P. Porta
Attorney, Agent, or Firm—Fitzpatrick, Cella, Harper & Scinto

[57] ABSTRACT

An exposure apparatus includes a light source for exposing a wafer through a mask; a light blocking device being movable and effective to block light from the light source to limit an exposure zone; a positional deviation detecting system for detecting positional deviation between the mask and the wafer; and a drive control system for moving the light blocking device to execute position control therefor, on the basis of a detection signal from the positional deviation detecting system.

7 Claims, 4 Drawing Sheets

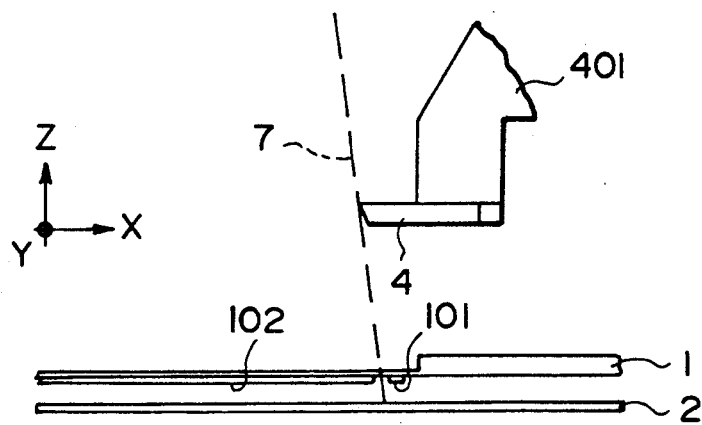
F I G. 4
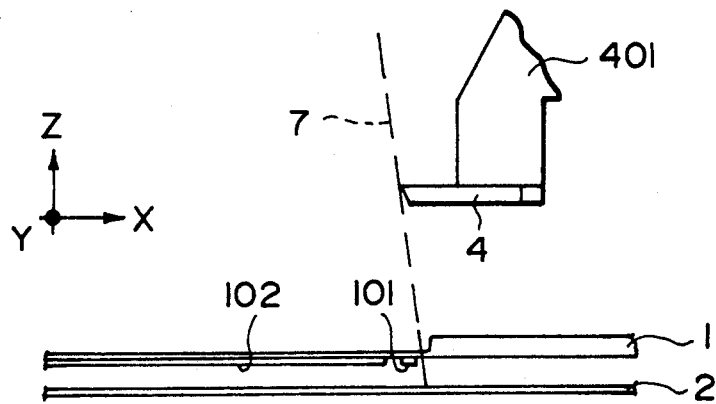
F I G. 5
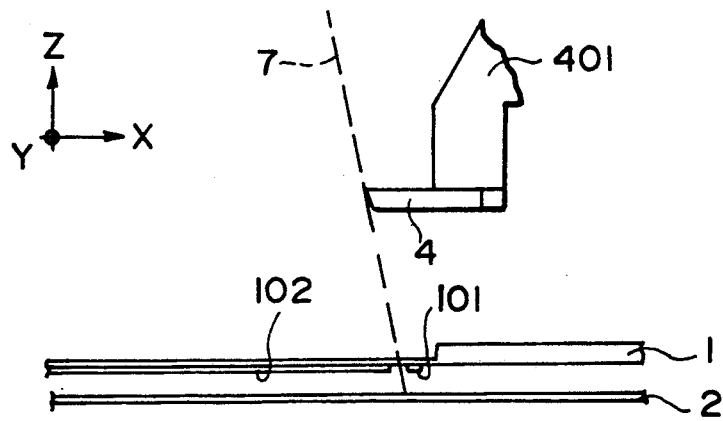
F I G. 6

EXPOSURE APPARATUS

This application is a continuation of prior application, Ser. No. 07/718,928 filed Jun. 25, 1991, which application is a continuation of prior application, Ser. No. 07/584,796 filed Sep. 19, 1990, both now abandoned.

FIELD OF THE INVENTION AND RELATED ART

This invention relates to an exposure apparatus and, more particularly, to an exposure field angle limiting means for use in an exposure apparatus of step-and-repeat type wherein one wafer is repeatedly subjected to zone exposure.

The manufacture of integrated circuits or semiconductor devices involves repetition of a process of transferring a pattern of a mask to a wafer which is coated with a photosensitive material. Particularly, in consideration of decreasing linewidth of a pattern, an exposure apparatus which uses X-rays as a light source means for the exposure, has been developed.

As an example of such an X-ray exposure apparatus, there is a step-and-repeat type exposure apparatus wherein the surface of one wafer is divided into plural zones to reduce the size of each exposure region to which the pattern transfer is effected by a single exposure operation. To these divided exposure regions, exposures are executed sequentially while moving the wafer stepwise relatively to the mask.

This step-and-repeat method is effective for a high-precision X-ray exposure apparatus. In this method, it is necessary to use a specific means for limiting the exposure zone so as to prevent a surrounding portion of the wafer from being exposed.

Such exposure zone limiting means may be provided by covering the outside of a circuit pattern area defined on a mask with an aperture member having large X-ray absorbency. Since the necessary exposure zone is determined by the circuit pattern of the mask, the aperture member for limiting the exposure zone has to be positioned with respect to the circuit pattern of the mask. If the positioning precision is not good, the exposure zone is expanded excessively, which leads to enlargement of the spacing between adjacent exposure zones on the wafer. This results in expansion of a blank portion of each wafer, having no circuit pattern, and thus the efficiency decreases.

Accordingly, the aperture member for limiting the exposure zone has to be positioned with good precision.

Generally, around a circuit pattern area of a mask, there are formed alignment marks for attaining alignment between the circuit pattern of the mask with a circuit pattern already printed on the wafer. The exposure apparatus is equipped with detecting means for detecting positional deviation related to these alignment marks. In order to prevent exposure of such alignment marks, the aperture member for limiting the exposure zone should cover these alignment marks against the exposure illumination light. If the aperture member is maintained in this state, however, it blocks the light path for an optical system of the positional deviation detecting means. Therefore, it is necessary to provide a function for moving the aperture member, at the time of positional deviation detection, from the position covering the alignment mark against the exposure illumination light to a position not covering the alignment marks.

Examples of exposure apparatus are disclosed in Japanese Laid-Open Patent Applications, Laid-Open Nos. Sho 62-262428, Sho 52-5504 and Sho 60-45252, for example.

SUMMARY OF THE INVENTION

Japanese Laid-Open Patent Application, Laid-Open No. Sho 62-262428 discloses a specific film structure for a mask which has large X-ray absorbency at a region outside a circuit pattern area. But, it does not mention prevention of exposure of an alignment mark area.

Japanese Laid-Open Patent Application, Laid-Open No. Sho 52-5504 discloses a solution for preventing exposure of an alignment mark area. However, if X-rays are used as a light source, the disclosed solution cannot be applied easily. To avoid such inconveniences, illumination zone limiting means (means for defining an aperture) separate from a mask may be provided as disclosed in Japanese Laid-Open Patent Application, Laid-Open No. Sho 60-45252. However, even this publication does not mention the manner of relatively positioning such limiting means and an edge of the pattern area of a mask, with good precision.

It is accordingly an object of the present invention to provide an exposure apparatus, by which the exposure zone can be limited at high precision without exposure of an alignment mark on a mask.

In accordance with an aspect of the present invention, to achieve this object, there is provided an exposure apparatus including means for detecting positional deviation between a mask and a wafer, and light blocking means capable of limiting an exposure zone to the mask, wherein the positional relationship between the light blocking means and the circuit pattern area of the mask can be detected by using the detecting means, whereby the light blocking means can be positioned with good precision.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2-6 are schematic representations, respectively, illustrating various operational positions of an aperture blade means.

DESCRIPTION OF THE PREFERRED EMBODIMENTS

Figure 1:
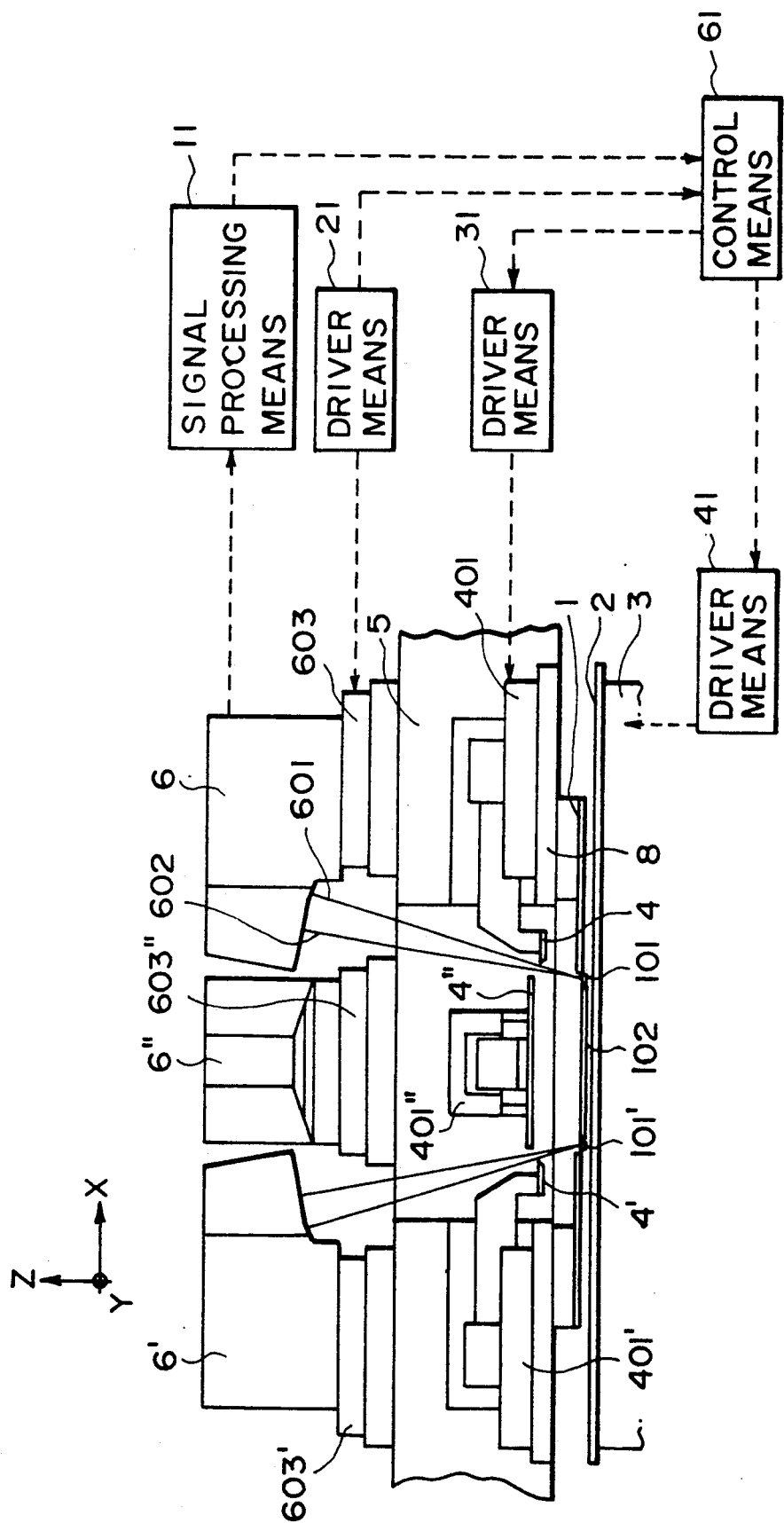
FIG. 1 is a sectional view, schematically and diagrammatically showing a portion of an exposure apparatus to which the present invention is applied.

FIG. 1 is a sectional view of a portion of an exposure apparatus, and schematically illustrates the portion to which the present invention is applied.

Denoted at 4 is an aperture blade effective to limit the exposure zone. The blade 4 is made of a metal plate having a sufficient thickness for preventing transmission of exposure light from an unshown exposure light source, such as light of g-line or i-line, excimer laser light or X-rays, for example. Denoted at 401 is an aperture moving stage for moving the aperture blade 4 along the X-axis.

Figure 7:
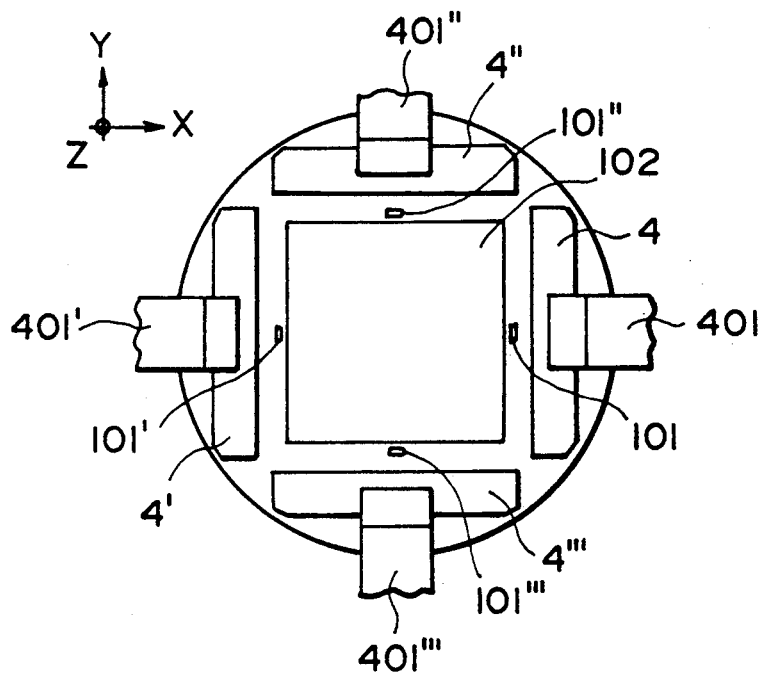
FIGS. 7 and 8 are top plan views, respectively, of the aperture blade means in the states shown in FIGS. 3 and 4, respectively.

The aperture moving stage 401 comprises a single-axis (X-axis) stage and is effective to set the aperture blade 4 at a desired position with respect to the X-axis direction in accordance with a required field angle. As best seen in FIG. 7, actually the exposure apparatus is equipped with four aperture blades 4, 4′, 4″ and 4‴ as well as four aperture moving stages 401, 401′, 401″ and 401‴, which correspond to four sides of the field angle (circuit pattern 102) of the mask. The aperture blades 4 and 4′ are disposed so as to sandwich the circuit pattern 102 therebetween with respect to the X-axis direction, while the aperture blades 4″ and 4‴ are disposed so as to sandwich the circuit pattern 102 therebetween with respect to the Y axis direction. In the disclosed example, with respect to the XYZ coordinate system illustrated, the Z axis is substantially parallel to the direction of projection of the exposure light. Also, the stages 401 and 401′ are adapted to move the aperture blades 4 and 4′ in the X axis direction, respectively, while the stages 401″ and 401‴ are adapted to move the corresponding aperture blades 4″ and 4‴ in the Y axis direction, respectively. Driving means 31 for the aperture moving stage 401 comprises a pulse motor drive or DC motor drive with an encoder, and the amount of movement can be controlled in response to an external signal. Denoted at 6 is a positional deviation detecting means for measuring any positional deviation between the pattern 102 formed on the mask substrate 1 and a pattern having already been printed on a wafer 2. Detection of such positional deviation is executed generally by detecting the positional deviation related to a corresponding alignment mark or marks (101) formed at a portion surrounding the circuit pattern 102.

In this embodiment, the detecting means 6 is operable to detect the positional deviation between the alignment mark 101 of the mask 1, formed at a portion around the circuit pattern 102 of the mask 1, and a corresponding alignment mark (not shown) of the wafer 2. However, in consideration of a possibility that the detecting means 6 can detect positional deviation with respect to only one direction, i.e., the X or Y axis direction, the exposure apparatus is equipped with four positional deviation detecting means (although only three are illustrated at 6, 6′ and 6″). These four positional deviation detecting means are associated with four alignment marks 101, 101′, 101″ and 101‴ (see FIG. 7) formed around the four sides of the circuit pattern 102.

Reference numeral 601 denotes a laser beam which is projected from corresponding positional deviation detecting means, and it is a light source for obtaining a positional deviation detection signal. Reference numeral 602 denotes the central axis of the light to be received by a light receiving portion of the positional deviation detecting means 6, which light cooperates with the alignment mark 101 on the mask substrate and the alignment mark (not shown) on the wafer and bears a signal corresponding to the positional deviation between these marks.

The positional deviation signal is processed by a signal processing means 11 and, then, it is transmitted to a control means 51 for calculation of positional deviation between the mask 1 and the wafer 2. In accordance with the thus calculated positional deviation, the control means 51 produces and supplies a drive instruction signal to a driving means 41 to move a wafer stage 3, carrying thereon the wafer 2, along the X-Y plane to thereby align the wafer with respect to the mask 1. The wafer stage 3 is also adapted to be moved by the driving means 41 stepwise for execution of the step-and-repeat exposure, printing the mask pattern 102 to different shot areas (zones) on the wafer 2.

For obtaining the positional deviation signal with good precision, the laser beam 601 has to be positioned at a certain precision, with respect to the alignment mark 101.

There are cases in which the size of the circuit pattern is different. Also, it is possible that the disposition of alignment marks is different in each mask. In consideration thereof, each positional deviation detecting means is equipped with a stage 603, for example, which is movable in two, X and Y directions with the cooperation of a driving means 31, for allowing observation of a corresponding alignment mark formed within a certain region.

The stage device 603 is provided at a position which is far away from the mask 1 with respect to the Z-axis direction, as compared with the stage device 401. This is to allow the blade 4 (4′–4‴) to be disposed close to the mask 1, for enhanced precision of limitation of the exposure zone by the blade. In the present embodiment, therefore, the positional deviation detecting means 6 (6′–6‴) detects a corresponding alignment mark through the aperture (zone for the exposure) defined by the blades 4–4‴.

Figure 8:
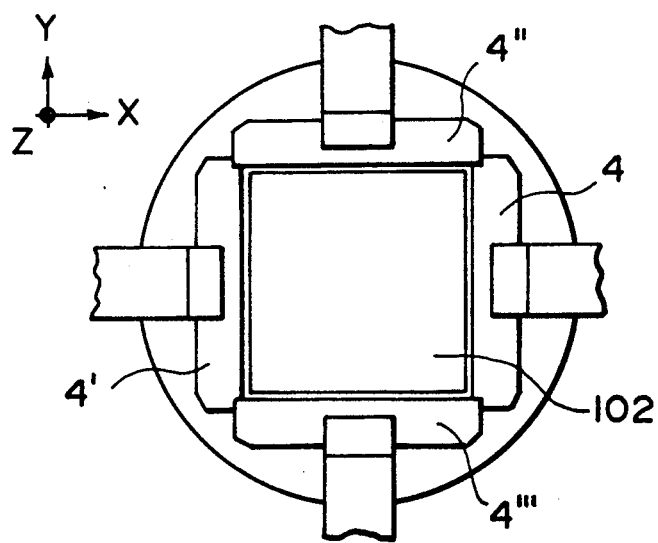

FIGS. 2–6 are sectional views, respectively, each showing a portion around the circuit pattern. FIGS. 7 and 8 are top plan views, respectively, each showing the circuit pattern, the alignment marks and the aperture blades as viewed from the exposure light source side.

It is seen from theses drawings that the aperture blade 4 (4′–4‴) is supported by the stage 401 (401′–401‴) at the middle thereof in the direction (Y-axis direction, in the case of the blade 4) along the side that limits the exposure zone. Also, the blade supporting end of the stage 401 (401′–401‴) has a downwardly extending portion as viewed in FIG. 2, for example, so as to allow supporting of the blade 4 (4′–4‴) at a Z-axis position closest to the mask 1. In the paired blades 4 and 4′ and in the paired blades 4″ and 4‴, there is a difference in the mounting position with respect to the Z-axis. Thus, in tee Z-axis direction, a spacing is defined between adjacent blades. This is to prevent engagement between adjacent blades to avoid undesirable interference with to the blade movement. Also, this is effective to avoid the possibility of creation of dust or foreign particles.

The end face at the zone limiting side edge of each aperture blade 4 (4′–4‴) is inclined toward the mask 1 side, as best seen in FIG. 4, for example, such that this end face is not irradiated with the exposure light 7. This is effective since, if the end face of the zone limiting side edge of the aperture blade is irradiated with the exposure light 7, the light is reflected or scattered by the end face and a portion of the reflected or scattered light easily enters the exposure zone to disturb a correct exposure operation.

Next, the operation of the aperture blades will be explained in greater detail.

Figure 2:
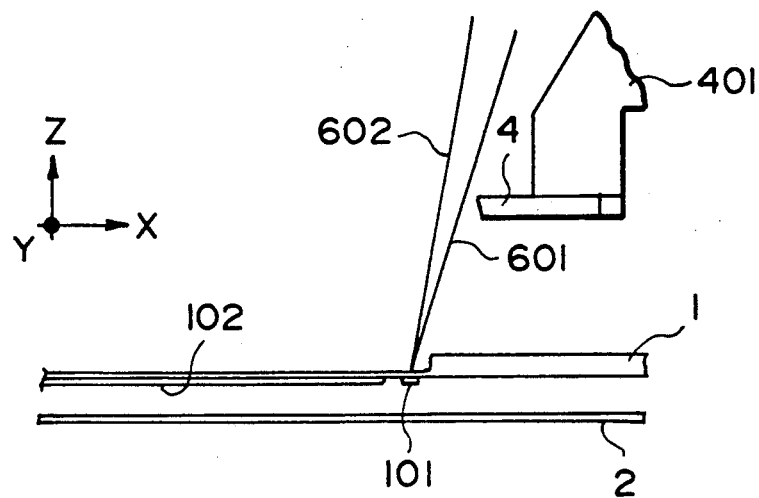

FIG. 2 illustrates the state in which positional deviation between the mask and the wafer is being executed. As illustrated, the aperture blade 4 is at a position sufficiently retracted from the alignment mark 101 so as not to block impingement of the laser beam 601 on the alignment mark 101.

Figure 3:
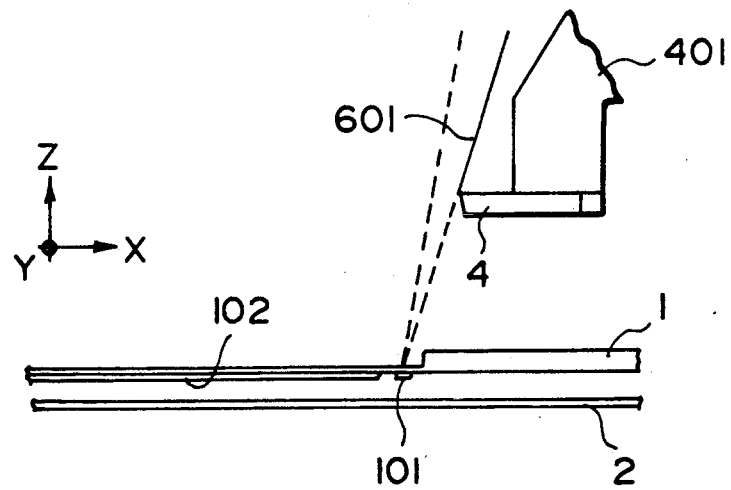

FIG. 3 illustrates the state in which, after completion of the alignment operation of the wafer with the mask in response to a positional deviation signal, the aperture blade 4 just enters into the path of the laser beam 601. The top plan view of FIG. 7 corresponds to this state.

At this time, the signal processing operation to be executed in the signal processing means 11 is set in a certain mode (e.g. a mode for detecting the presence/absence of a light reception signal from the light receiving portion of the positional deviation detecting means 6) which is different from that to be set at the time of detection of positional deviation.

When the aperture blade 4 comes to a position covering the alignment mark 101 against the laser beam 601, drive control means 51 (see FIG. 1) of the aperture moving stage receives a signal from the signal processing means of the positional deviation detecting device, whereby positional information related to the aperture blade 4 with respect to the alignment mark 10 is obtained.

FIG. 4 illustrates the position of the aperture blade as assumed during the exposure operation. In this state, the aperture blade protrudes toward the center of the exposure zone, as compared with the aperture blade position shown in FIG. 3 Reference numeral 7 denotes the exposure illumination light which passes the free end of the aperture blade 4. The aperture blade 4 covers the alignment mark 101 against the exposure illumination light, but it does not cover the circuit pattern area 102. Thus, the circuit pattern area can be exposed to the light 7, whereas the alignment mark is not exposed thereto.

The moving distance from the FIG. 3 position to the FIG. 4 position is determined by the disposition of the alignment mark 101 with respect to the edge of the circuit pattern area 102, the angle of projection of the laser beam 601 from the positional deviation detecting device, the angle of incidence of the exposure illumination light 7 and the distance between the mask 1 and the aperture blade 4 in the Z-axis direction. Since these numerical values are predetermined and fixed, it is possible to determine the moving distance from the FIG. 3 position to the FIG. 4 position, by calculation beforehand.

The top plan view of FIG. 8 corresponds to the state of FIG. 4.

FIG. 5 illustrates the position of the aperture blade 4 as assumed for exposure of the alignment mark 101. The moving distance from the FIG. 3 position can be calculated from the data similar to that in the case in which the alignment mark 101 is not to be exposed.

FIG. 6 illustrates a case where the size of the circuit pattern area 102 is smaller than that in the FIG. 4 case. If the exposure illumination light is provided by a light source having a certain angle of divergence, the angle of incidence of the exposure illumination light at the edge portion of the circuit pattern area changes and, therefore, the position of the aperture blade 4 changes accordingly.

As for the detection of the position of the aperture blade 4 with respect to the alignment mark 101, it is only necessary that the position detection is executed once each time a mask is mounted to the exposure apparatus. For example, when as shown in FIG. 4, the alignment mark 101 is not to be exposed, the aperture blade 4 may be moved backwardly by a predetermined distance for detection of positional deviation between the wafer 2 and the mask 1 while, on the other hand, for exposure, the aperture blade 4 may be moved forwardly by the predetermined distance, and this may be repeated. The moving distance in this case is fixed constantly, relative to one and the same mask.

When the alignment mark 101 is to be exposed as illustrated in FIG. 5, it is not necessary for the aperture blade 4 to be displaced from the illustrated position until the mask is replaced by another.

When X-rays are used as the pattern printing illumination light, each aperture blade may be made of a material, such as a heat resistive glass material, for example, which is non-transmissive to the X-rays but which is transmissive to laser light from the position detecting means 6, to be used for the alignment operation. On that occasion, with the aperture blades 4–4''' being held fixed at the positions shown in FIG. 6, it is possible to execute both the relative position detecting operation of the mask and the wafer through the detecting means 6–6''' and the blocking of the X-rays for the exposure zone limitation, at the same time. Further, on that occasion, only the zone limiting side edge portion of each aperture blade may be coated with a suitable metal material, non-transmissive to the alignment laser light 601 (FIG. 3). This makes it easy to detect the crossing of the zone limiting side edge of the blade with the laser light 601, with the cooperation of the detecting means 6 (6'-6'''). Alternatively, the signal processing means may be arranged to execute such a signal processing operation by which any shift of the path of the laser light 602, caused by crossing of the zone limiting side edge of the aperture blade with the laser light 601, can be detected.

In the preceding embodiment, after completion of the alignment of the mask 1 and the wafer 2 based on the outputs of the positional deviation detecting means 6–6''', the positioning of the aperture blades 4–4''' with reference to the alignment marks 101–101''' are executed. Such blade positioning may be executed when a new mask is set into the exposure apparatus. This will be explained below in detail.

In the apparatus shown in FIG. 1, in the initial state, neither the mask, nor the wafer are mounted. The aperture blade 4 (4'-4''') is at its initial position retracted away from the center of the exposure zone. Also, the deviation detecting means 6 (6'-6''') is at its initial position. Under such conditions, a mask 1 and a wafer 2 are introduced into the apparatus. At this time, it is possible that an error is produced with respect to the mounting of the mask and/or the wafer and, therefore, by an amount corresponding to the error, the position of each alignment mark 101 (101'-101''') is deviated from the predetermined mark setting position. As a consequence, moving the deviation detecting means 6 (6'-6''') from its initial position through a predetermined distance by the corresponding stage device 603 (603'-603''') does not always assure correct impingement of irradiation of the laser beam 601 from the detecting means 6 (6'-6'''), upon the alignment mark 101 (101'-101'''). In consideration of this, in this embodiment, the wafer stage 3 is moved so that a mark (not shown) provided thereon is opposed to the aforementioned mark setting position, and then, the laser beam 601 is projected thereto to detect any positional deviation of the alignment mark 101 (101'-101''') with respect to the mark setting position (i.e. the position irradiated by the laser beam 601), through the deviation detecting means 6 (6'-6'''). Then, the deviation detecting means is moved by the stage device 603 (603'-603''') in accordance with the detected deviation, so as to bring the alignment mark 101 (101'-101''') of the mask 1, set on the mask chuck 8, to such a position as can be correctly irradiated with the laser beam 601. It will be readily understood that such an adjusting operation may be executed without provision of a mark on the wafer stage. For example, the mask 1 may by provided with an additional mark which is in a predetermined positional relationship with the alignment mark 101 (101'-101'''), such that the additional mark can reflect the laser beam 601 toward the light receiving portion of the deviation detecting means 6 (6'-6''').

In any case, in the present embodiment, the laser beam can correctly impinge on the alignment mark 101 (101'-101'''), such that the positioning of the aperture blade 4 (4'-4''') with respect to the pattern 102 can be controlled accurately.

Since, in these embodiments, the position of the aperture blade (exposure zone limiting means) is determined with reference to an alignment mark provided on a mask substrate, as described in the foregoing, there is no necessity of setting an origin to be used as a reference for the positioning of the aperture moving stage.

Further, any positional error of the circuit pattern with respect to the exposure apparatus, resulting from any positional deviation caused when a mask is mounted to a mask chuck, does not lead to an error in the setting of the exposure zone.

As a result, the exposure zone can be set with good precision, and this contributes to enhancement of the efficiency in the use of a wafer, with respect to placement of exposure zones.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
   a light source for emitting a light beam and for exposing a wafer through a mask along an exposure path;
   light blocking means being movable and effective to block the light beam emitted from said light source to limit an exposure zone;
   positional deviation detecting means for detecting positional deviation between the mask and the wafer and for producing a detection signal; and
   drive control means for moving said light blocking means to execute position control therefor, on the basis of the detection signal produced by said positional deviation detecting means,
   wherein said light blocking means is disposed along the exposure path between said light source and the mask and is disposed between said position detecting means and the mask.

2. An apparatus according to claim 1, wherein the wafer is divided into plural exposure zones and wherein the exposure of the wafer is executed in a step-and-repeat manner in which the divided exposure zones are exposed in sequence.

3. An apparatus according to claim 1, wherein said light blocking means comprises four light blocking members corresponding to four sides of each exposure zone of rectangular shape and wherein each light blocking member is movable reciprocatingly along a straight line.

4. An apparatus according to claim 1, wherein said positional deviation detecting means comprises optical detecting means for optically detecting the relative position of the wafer and an alignment mark which is provided outside a circuit pattern forming area of the mask.

5. An exposure apparatus for exposing a mask and a wafer with X-rays to print a pattern of the mask on the wafer, said apparatus comprising:
   detecting means for detecting the relative position of the mask and the wafer said detecting means supplying a light beam to alignment marks of the mask and the wafer for detection of the relative position therebetween; and
   aperture means for variably defining a zone for irradiation of the mask with the X-rays, said aperture means being disposed between the mask and said detecting means with respect to the direction of supply of the X-rays, and said aperture means having a plurality of blades and a plurality of independent blade driving means associated with the plurality of blades, respectively;
   wherein a clearance is defined between adjacent blades, in the direction of the supply of the X-rays;
   wherein each blade has an irradiation zone limiting side edge having an end face which is inclined so as not to be irradiated with the X-rays; and
   wherein each of the plurality of blade driving means is adapted to support an associated one of said blades substantially at the middle thereof with respect to the zone limiting side of the blade.

6. In a semiconductor device manufacturing exposure method for exposing a wafer to a mask with X-rays to print a pattern of the mask on the wafer, the improvement comprising the steps of:
   projecting, from a mark detecting means, a light beam to an alignment mark provided for mask-to-wafer alignment;
   moving a movable blade of an aperture means to variably define a range for X-ray irradiation of the mask, wherein the movable blade is disposed between the mark detecting means and the mask with respect to a direction of projection of the X-rays;
   detecting the position of the blade by using the light beam;
   controlling the movement of the blade on the basis of the detection; and
   projecting X-rays to the mask through the aperture means.

7. A method according to claim 6, wherein the movable blade blocks the X-rays but transmits the light beam.

* * * * *